(12) United States Patent
Jiang et al.

(10) Patent No.: US 7,353,490 B2
(45) Date of Patent: Apr. 1, 2008

(54) POWER NETWORK SYNTHESIZER FOR AN INTEGRATED CIRCUIT DESIGN

(75) Inventors: Yi-Min Jiang, San Jose, CA (US); Philip Hui Yuh Tai, Cupertino, CA (US); Sung-Hoon Kwon, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 155 days.

(21) Appl. No.: 10/976,411

(22) Filed: Oct. 29, 2004

(65) Prior Publication Data
US 2006/0095874 A1 May 4, 2006

(51) Int. Cl.
*G06F 17/50* (2006.01)
(52) U.S. Cl. .............................. 716/18; 716/12; 716/15
(58) Field of Classification Search .................. 716/1, 716/2, 12, 15, 18
See application file for complete search history.

(56) References Cited

U.S. PATENT DOCUMENTS

| | | | | |
|---|---|---|---|---|
| 4,726,991 A | 2/1988 | Hyatt et al. | ................. | 428/329 |
| 4,811,237 A | 3/1989 | Putatunda et al. | ......... | 364/491 |
| 5,598,348 A | 1/1997 | Rusu et al. | ................. | 364/491 |
| 5,808,900 A | 9/1998 | Buer et al. | .................... | 716/10 |
| 5,933,358 A | 8/1999 | Koh et al. | .................... | 704/14 |
| 6,043,672 A | 3/2000 | Sugasawara | ............... | 324/765 |
| 6,202,191 B1 | 3/2001 | Filippi et al. | .................. | 716/5 |
| 6,202,196 B1 | 3/2001 | Huang et al. | ................. | 716/14 |
| 6,308,307 B1 | 10/2001 | Cano et al. | .................... | 716/8 |
| 6,311,147 B1 | 10/2001 | Tuan et al. | .................... | 703/18 |
| 6,405,357 B1 | 6/2002 | Chao et al. | ................... | 716/10 |
| 6,446,245 B1 | 9/2002 | Xing et al. | .................... | 716/10 |
| 6,457,157 B1 | 9/2002 | Singh et al. | .................. | 716/2 |
| 6,487,706 B1 | 11/2002 | Barkley et al. | ................ | 716/7 |
| 6,510,539 B1 | 1/2003 | Deemie et al. | | |
| 6,523,154 B2 | 2/2003 | Cohn et al. | .................... | 716/6 |
| 6,598,206 B2 | 7/2003 | Darden et al. | | |
| 6,675,139 B1 | 1/2004 | Jetton et al. | ................. | 703/17 |
| 6,981,230 B1 | 12/2005 | Lin et al. | ....................... | 716/1 |
| 6,991,961 B2 | 1/2006 | Hubbard et al. | ........... | 438/106 |
| 7,043,389 B2 | 5/2006 | Plusquellic | ................. | 702/117 |

(Continued)

OTHER PUBLICATIONS

Office Action dated Jul. 27, 2007 in U.S. Appl. No. 10/976,653.

(Continued)

*Primary Examiner*—Thuan Do
(74) *Attorney, Agent, or Firm*—Silicon Valley Patent Group LLP; Omkar Suryadevara

(57) ABSTRACT

A plan for a power network for an integrated circuit device is automatically preparing in two stages. In a first stage, a number of simplified plans are prepared on a global scale, without regard to design rule checking constraints and routing blockages. Next, the simplified plans are evaluated to select a plan that conforms to a user-specified limit for an attribute, such as maximum voltage drop. The selected simplified plan, which identifies a total count of power wires and a width of the power wires, is used in a second stage to prepare a more detailed plan that honors the design rule checking constraints and routing blockages. The detailed plan is evaluated to check for conformance with the user-specified limit on the attribute, and if necessary the detailed plan is changed, e.g. by increasing wire width one or more times, to achieve conformance.

18 Claims, 10 Drawing Sheets

U.S. PATENT DOCUMENTS

| | | | |
|---|---|---|---|
| 7,111,265 | B1 | 9/2006 | Tan et al. ............... 716/10 |
| 2001/0039642 | A1 | 11/2001 | Anzai ............... 716/10 |
| 2002/0013931 | A1 | 1/2002 | Cano et al. ............... 716/1 |
| 2002/0170020 | A1 | 11/2002 | Darden et al. |
| 2003/0140327 | A1 | 7/2003 | Lai et al. ............... 716/12 |
| 2003/0151047 | A1 | 8/2003 | Corbett et al. ............... 257/48 |
| 2003/0237059 | A1 | 12/2003 | Sclrultz ............... 716/4 |
| 2004/0088443 | A1 | 5/2004 | Tran et al. ............... 710/1 |
| 2004/0163054 | A1 | 8/2004 | Frank et al. ............... 716/10 |
| 2004/0268281 | A1 | 12/2004 | Dotson et al. ............... 716/10 |
| 2005/0050502 | A1* | 3/2005 | Kurihara et al. ............... 716/10 |
| 2005/0090916 | A1 | 4/2005 | Aghababazadeh et al. .... 700/90 |
| 2005/0236177 | A1 | 10/2005 | Inagaki et al. |
| 2006/0080630 | A1* | 4/2006 | Lin ............... 716/11 |
| 2006/0095872 | A1 | 5/2006 | McElvain et al. ............... 716/1 |
| 2006/0239102 | A1* | 10/2006 | Saita et al. ............... 365/226 |

OTHER PUBLICATIONS

U.S.Appl. No. 10/976,719, filed on Oct. 29, 2004 by Kwon et al.
Office Action dated Feb. 9, 2007 in U.S. Appl. No. 10/976,719.
Amendment dated Jun. 11, 2007 in U.S. Appl. No. 10/976,719.
U.S. Appl. No. 10/976,653, filed on Oct. 29, 2004 by Tai et al.
Office Action dated Jan. 29, 2007 in U.S. Appl. No. 10/976,653.
Amenedemnt dated Apr. 30, 2007 in U.S. Appl. No. 10/976,653.
M. Zhao et al., Optimal Placement of Power Supply Pads and Pins, (DAC), pp. 165-170, 2004.
J. Oh et al., "Multi-pad Power/Ground Network Design for Uniform Distribution of Ground Bounce", (DAC), pp. 287-290, 1998.
S. R. Nassif et al., "Fast Power Grid Simulation", (DAC), 2000.
H. Su et al., "Analysis and Optimization of Structured Power/Ground Networks", Department of Electrical and Computer Engineering University of Minnesota, (date believed to be prior to Oct. 2004).
L. T. Pillage et al, "Electronic Circuit and System Simulation Methods", McGraw-Hill, Inc., 1994.
Gupta et al. "A High Level Interconnect Power Model for Design Space Exploration", Intnl. Conference on Computer Aided Design, Nov. 9-13, 2003, pp. 551-558.
Chen, H.H. et al., "Power Supply Noise Analysis Methodology for Deep-Submicron VLSI Chip Design", (DAC), 1997, p. 6;.
Nassif, S.R. et al., "Fast Power Grid Simulation", (DAC), 2000, p. 6;.
Su, H. et al., "Analysis and Optimization of Structured Power/Ground Networks", Department of Electrical and Computer Engineering University of Minnesota, (date believed to be prior to Oct. 2004), p. 33;.
Golub, G.H. et al., "Matrix Computations", 520-537, Third Edition 1996, The Johns Hopkins University Press, p. 20;.
Eisenstat, S.C. et al., "Yale Sparse Matrix Package I: The Symmetric Codes", International Journal for Numerical Methods in Engineering, vol. 18, 1145-1151 (1982), p. 7;.
Pillage, L.T. et al., "Electronics Circuit and System Simulation Methods", McGraw-Hill, Inc., 1994, p. 11;.
Bentley, J.L. et al., "Data Structures for Range Searching", Computer Surveys, vol. 11, No. 4, Dec. 1979, pp. 397-409, p. 13.
Office Action dated Aug. 27, 2007 by Examiner Suchin Parihar in U.S. Appl. No. 10/976,719.
Amendment dated Oct. 29, 2007 in U.S. Appl. 10/976,719;.
Amendment dated Oct. 29, 2007 in U.S. Appl. 10/976,653.
Entire Prosecution History of U.S. Appl. No. 11/930,020, filed on Oct. 30, 2007;.
Entire Prosecution History of U.S. Appl. No. 11/982,094, filed on Oct. 31, 2007;.
Notice of Allowance dated Nov. 30, 2007 in U.S. Appl. No. 10/976,653.

* cited by examiner

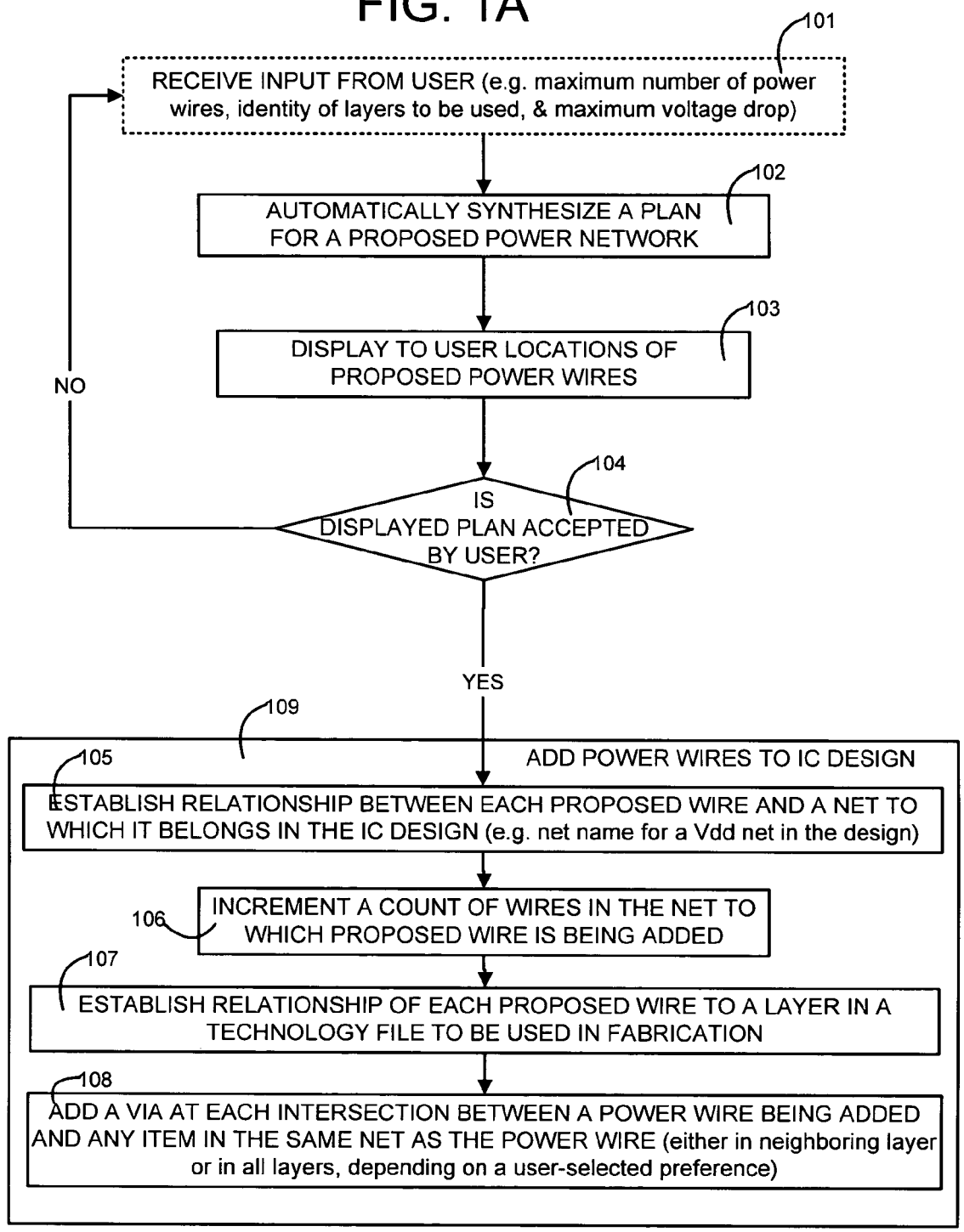

POWER NETWORK SYNTHESIZER FOR AN INTEGRATED CIRCUIT DESIGN

CROSS-REFERENCE TO RELATED APPLICATIONS

This application is related to and incorporates by reference herein in their entirety the following two commonly-owned, concurrently-filed and co-pending patent applications, including the CD-ROM appendices present therein:

U.S. patent application Ser. No. 10/976,719, entitled "POWER PAD SYNTHESIZER FOR AN INTEGRATED CIRCUIT DESIGN" filed by Sung-Hoon Kwon, Philip Hui-Yuh Tai and Yi-Min Jiang; and U.S. patent application Ser. No. 10/976,653, entitled "POWER NETWORK ANALYZER FOR AN INTEGRATED CIRCUIT DESIGN" filed by Philip Hui-Yuh Tai, Yi-Min Jiang and Sung-Hoon Kwon.

CROSS-REFERENCE TO COMPUTER PROGRAM LISTING APPENDIX

An Appendix included in this patent application contains the following files in IBM-PC format compatible with MS-Windows in one CD-ROM (of which two identical copies are attached hereto), and this appendix is an integral part of the present disclosure and is incorporated by reference herein in its entirety:
Volume in drive D is 041029_1119
Volume Serial Number is EBD2-ABA7

| Directory of D:\ | |
|---|---|
| 10/27/2004 01:22p | 13,672 PLAN.TXT |
| 1 File(s) | 13,672 bytes |
| 0 Dir(s) | 0 bytes free |

The above-identified file contains pseudo-code for use in preparation of a computer program for one embodiment of the invention.

BACKGROUND

1. Field of the Invention

The invention relates to design of semiconductor chips. More specifically, the invention relates to a method and an apparatus for generating a plan for a power supply network to be added to a design of an integrated circuit.

2. Related Art

A power supply network for an integrated circuit (IC) design can be created in any of a number of different ways known in the prior art. U.S. Pat. No. 4,811,237 granted to Putatunda et al. on Mar. 7, 1989 entitled "Structured Design Method For Generation A Mesh Power Bus Structure In High Density Layout Of VLSI Chips" is incorporated by reference herein in its entirety. This patent describes an automated layout of a power bus distribution network.

U.S. Pat. No. 6,446,245 granted to Xing et al. on Sep. 3, 2002 and entitled "Method and Apparatus for performing power routing in ASIC design" is incorporated by reference herein in its entirety. This patent states that traditionally power routing is performed during the floor planning stage, before cell placement, and for this reason the location of the standard cells and hence the power consumption behavior is not known at the power routing stage. Also this design flow creates obstacles for cell placement optimization. Therefore, this patent describes a method in which standard cells are placed in the physical layout prior to power routing, and they are placed in a bottom-up hierarchical manner.

SUMMARY

A design of an integrated circuit (IC) device, in which locations of memory and/or logic circuitry (such as a standard cell or a hard macro cell) are identified, is used in a computer that is appropriately programmed (also called "power network synthesizer") to automatically propose locations of wires that are to carry power. The computer is further programmed to automatically display the proposed locations of the power wires. On receiving manual approval of the displayed power plan, the computer is programmed to automatically add at least some information about locations of proposed wires to the IC design (e.g. create the proposed wires in the IC design and relate them to the IC design).

If a circuit designer is not satisfied with the automatically generated power plan, the circuit designer may either repeat the just-described process with different inputs or change the IC design or both. Therefore, the circuit designer may change the floor plan of their IC design as often as necessary, to generate a power plan they find to be satisfactory, before layout and before post-layout simulation which saves time otherwise required in the prior art.

In some embodiments, the computer is programmed to propose power wires in at least two stages as follows. In a first stage, a number of simplified plans are prepared, at a global level, without regard to design rule checking constraints and/or blockages to routing. The simplified plans are automatically evaluated by the computer to select one of them which conforms to a user-specified limit for an attribute, such as maximum voltage drop. The selected simplified plan, which identifies a total count of power wires and a width of the power wires, is used by the computer in a second stage to prepare a more detailed plan that honors design rule checking constraints and routing blockages. The detailed plan is automatically evaluated by the computer to check for conformance with the user-specified limit on the attribute, and if necessary the detailed plan is automatically changed, e.g. by increasing wire width one or more times, to achieve conformance. Locations of proposed wires in the resulting detailed plan are displayed to a user, and on approval, the plan is used in invoking a power router for adding power wires to the IC design.

Depending on the embodiment, a power network synthesizer may perform the above-described acts in different order. Specifically, one power network synthesizer prepares a set of simplified plans to be evaluated, and thereafter evaluates each simplified plan to select one of them, whereas another power network synthesizer performs a binary search over a design parameter used in plan preparation (e.g. over a range between a maximum number of wires and a minimum number of wires). Therefore, numerous such power network synthesizers will become apparent to the skilled artisan.

BRIEF DESCRIPTION OF THE FIGURES

FIG. 1A illustrates, in a high-level flow chart in accordance with the invention, wherein a plan for a power network is automatically synthesized, displayed to the user and on user approval added to an integrated circuit (IC) design.

DETAILED DESCRIPTION

A computer is programmed in accordance with the invention to receive a design of an integrated circuit device, in which locations of memory and/or logic circuitry (such as instances of standard cells or hard macros have been identified, and automatically synthesize a plan for a network of power-carrying wires to be included in the design. The power-carrying wires are hereinafter referred to simply as "power wires". Note that the power wires can be at any predetermined voltage, e.g. Vdd or Vss or ground.

Figure 4A:
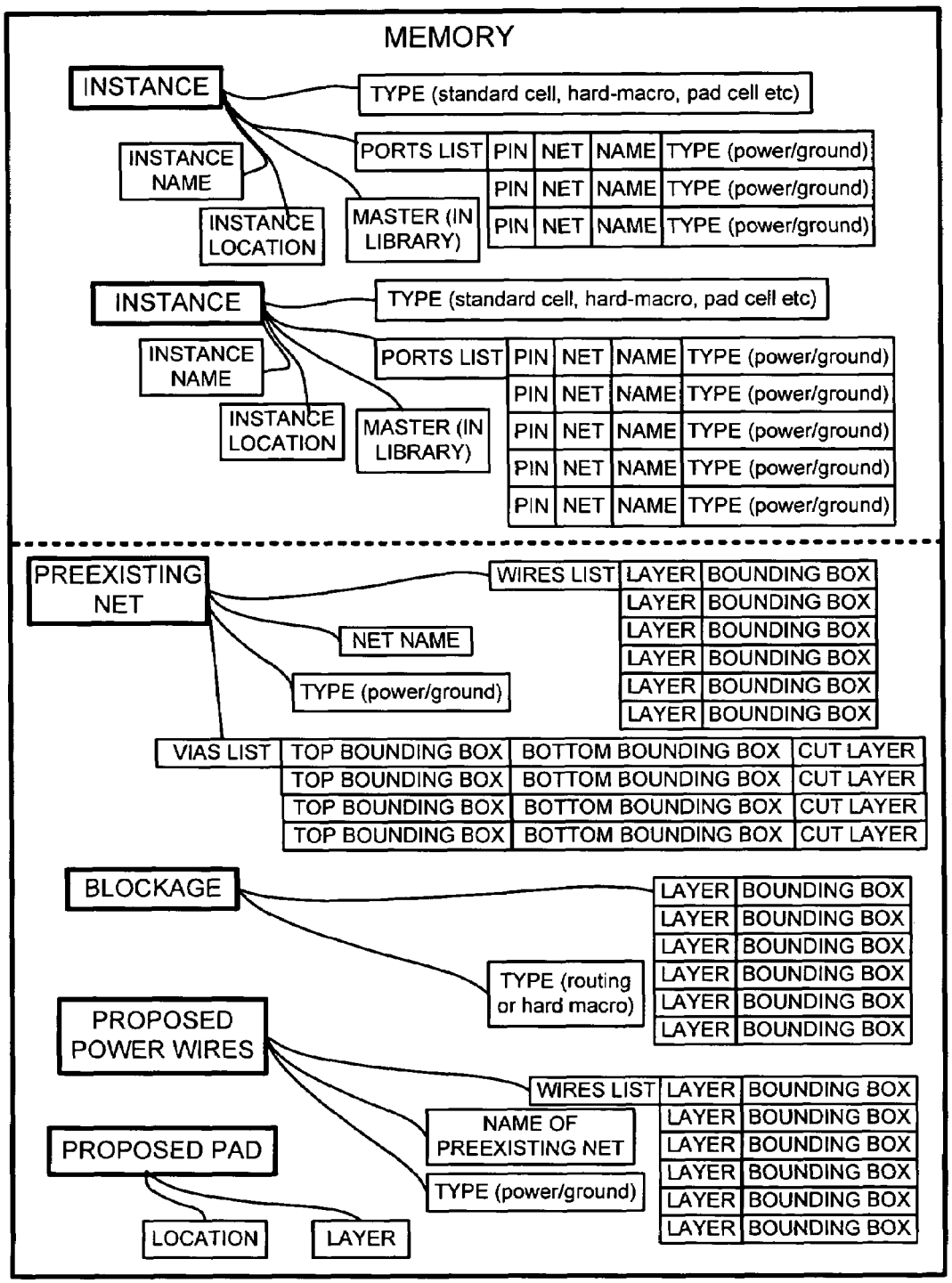
FIG. 4A illustrates, in a block diagram, data structures in the memory of a programmed computer when performing the method of FIG. 1B, in the exemplary implementation.

In some embodiments, the programmed computer receives the just-described information from an integrated circuit (IC) design database (such as, e.g. MILKYWAY) which holds a netlist produced by synthesis of a description originally expressed in a hardware description language, such as VERILOG or VHDL. The computer is programmed to retrieve from a database (located in persistent storage such as a hard disk) and store into its main memory, location data on the circuitry (as illustrated in FIG. 4A). Note that the programmed computer also has access to one or more libraries in the normal manner, such as a master file which identifies pin shapes, and a technology file which identifies information on various layers (such as metal layer 1, metal layer 2, ... cut layer 1 etc).

Such a computer is programmed in accordance with the invention, to automatically prepare a power plan for the IC design (as per act 102 in FIG. 1A), display the proposed locations of power wires (as per act 103) and on receiving manual approval for the displayed power plan (see act 104), to automatically add information from the power plan to the IC design (as per act 109). An advantage of performing the just-described acts in this order is that if a circuit designer is not satisfied with a power plan that is automatically generated as per act 102, the circuit designer may either repeat the just-described process with different inputs or change the IC design or both.

In many embodiments, a computer is programmed to prepare a power plan in act 102 that is responsive to one or more constraints which may be either predetermined (e.g. hard coded) or received from the user (or both—e.g. if defaults are hard coded to be overwritten by user-supplied constraints). Therefore, in some embodiments, act 102 is preceded by an act 101 in which the programmed computer receives one or more inputs from the user.

The inputs that are received may be any of: (a) maximum number of power wires to be used in the power plan (b) the identity of layers that are to be used in the power plan and (c) a limit or a range of an attribute value, such as maximum voltage drop. In act 101, the computer may also receive from the user input on proposed power pads and/or proposed power wires, depending on the embodiment. For an illustration of the type of input received from the circuit designer, see FIG. 3B which is described below. Note that act 101 is shown dotted in FIG. 1A because it may be skipped, e.g. if predetermined values are used.

Note that in act 103, the information that is displayed may be different, depending on the embodiment. For example, some embodiments may simply display the locations of proposed power wires as lines whereas other embodiments may display not only the location but also the width of the proposed power wires. Moreover, some embodiments may display, superposed on the proposed power wires, locations of various items in the IC design, such as hard macros.

Furthermore, certain embodiments may display, overlaid on the proposed power wires, a color map of additional information to be used by a circuit designer in evaluating the displayed power plan. Examples of the displayed information, which is automatically computed based on the proposed power network, include voltage drops (or other attribute values) in the IC design, average width of the power wires, maximum width of the power wires (e.g. shown as a number), and routing track usage of the power wires (e.g. displayed in color).

On receiving manual approval for the displayed power plan, the computer is programmed to add the locations of proposed wires to the IC design (as per act 109 in FIG. 1A), and perform any additional acts required to commit the power plan to the IC design. For example, as illustrated in FIG. 1A, in some embodiments the computer is programmed to establish a relationship (as per act 105) between each proposed power wire and a power net to which it belongs in the IC design (e.g. associate a proposed Vdd power wire to a specific net name that is being used for the Vdd net in the IC design). The computer of such embodiments is further programmed to increment a count of wires in the net to which proposed wire is being added (as per act 106). In several embodiments, the computer is programmed to establish, during the commit operation, a relationship (as per act 107) of each proposed power wire to a layer (such as metal 7) in a technology file that is to be used in fabrication of the wire. Furthermore, some embodiments add a via (as per act 108 in FIG. 1A), at each intersection between a power wire being added and any item (such as another power wire or pins of circuitry such as standard cell or hard macro cell) in the same net as the power wire (either in neighboring layer or in all layers, depending on a user-selected preference).

Note that the specific acts that are performed when committing a power plan to an IC design are different, depending on the embodiment. In many such embodiments, the computer is also programmed to add a via at each intersection between a power wire being added and any item in the same net as the power wire. The just-described item may be another power wire or a standard cell or a hard macro cell for example. Moreover, depending on the embodiment, the item may be (1) required to be in neighboring layer for the addition of the via, or (2) present in any layer and the choice between (1) and (2) is made based on a user-selected preference.

In some embodiments, a computer is programmed to automatically prepare a power plan for the IC design as per act 102 in FIG. 1A, in two or more stages, as follows. In a first stage 110 (FIG. 1B), several simplified plans are prepared, at a global level, without regard to design rule checking constraints and blockages to routing, and one of them is selected for use in a second stage 120. In the second stage 120, the simplified plan from the first stage is used to prepare a detailed plan taking into account the design rule checking constraints and routing blockages.

Figure 1B:
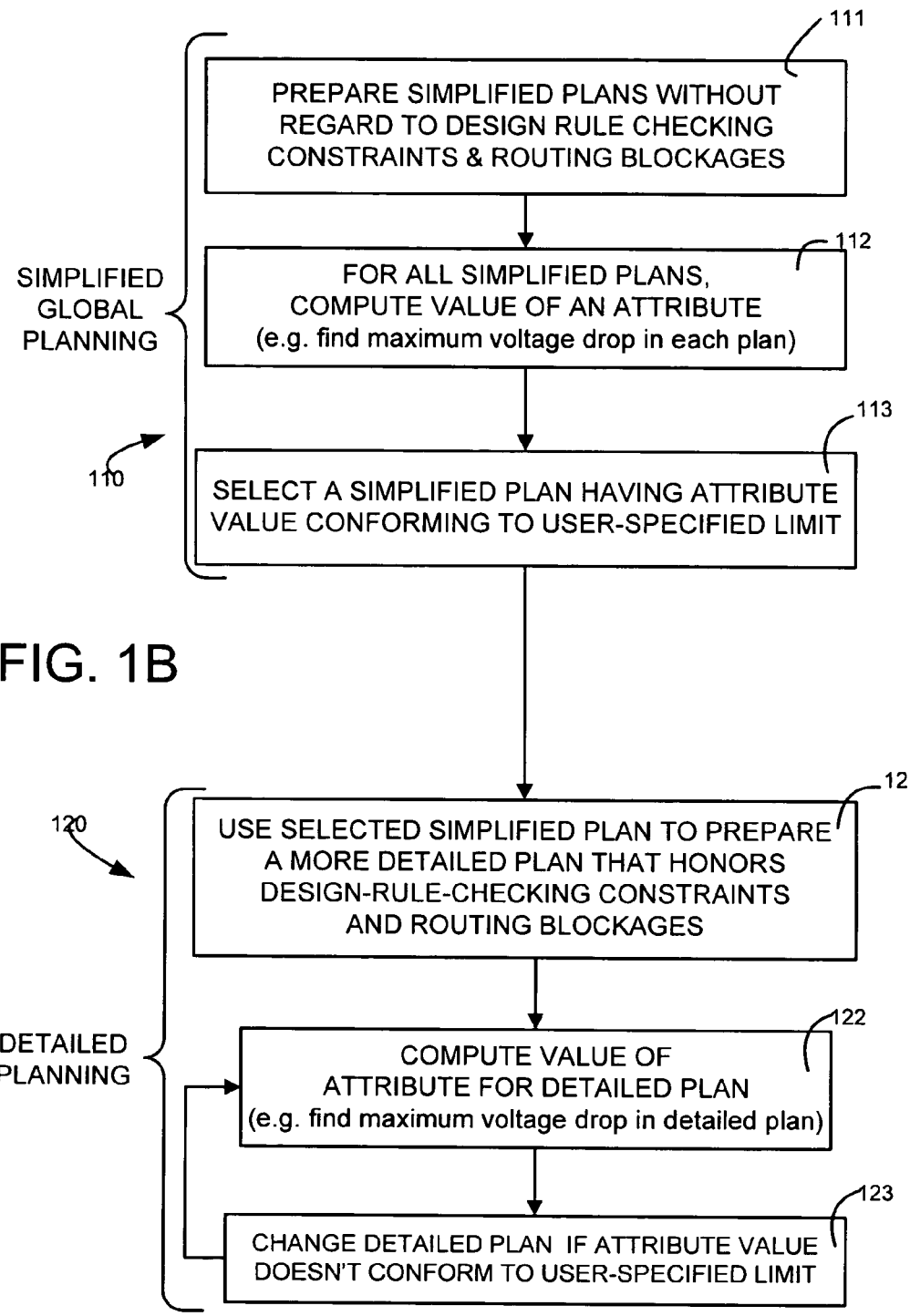
FIG. 1B illustrates, acts performed in two stages to implement operation 102 of FIG. 1A that synthesizes a plan for a power network in an integrated circuit (IC) design.

In a first stage, a number of simplified plans are prepared by the programmed computer, at a global level, without regard to design rule checking constraints and/or blockages to routing (see act 111 in FIG. 1B). The power wires being proposed in a simplified plan simply define locations in the form of an array of horizontal rectangles to be used in one layer and an array of vertical rectangles to be used in another layer. In this first stage 110, each simplified power plan is automatically analyzed (as per act 112) to compute a value of an attribute, such as the maximum voltage drop, for which the user may have specified a limit (e.g. in the form of a constraint as discussed above in reference to act 101 in FIG. 1A). Note that instead of maximum voltage drop, any other attribute, such as maximum current and/or maximum electromigration and/or maximum capacitance may be used in other embodiments.

Act 112 (FIG. 1B) can be performed by invoking any conventional analyzer for a power network, such as the analyzer described in U.S. Pat. No. 6,523,154, as long as the analyzer can handle unconnected circuit elements (such as hard macros, standard cells, pad cells and wires). In some embodiments, act 112 is performed by invoking a power network analyzer of the type described in a concurrently-filed U.S. patent application Ser. No. 10/976,653, that has been incorporated by reference above.

Figure 3A:
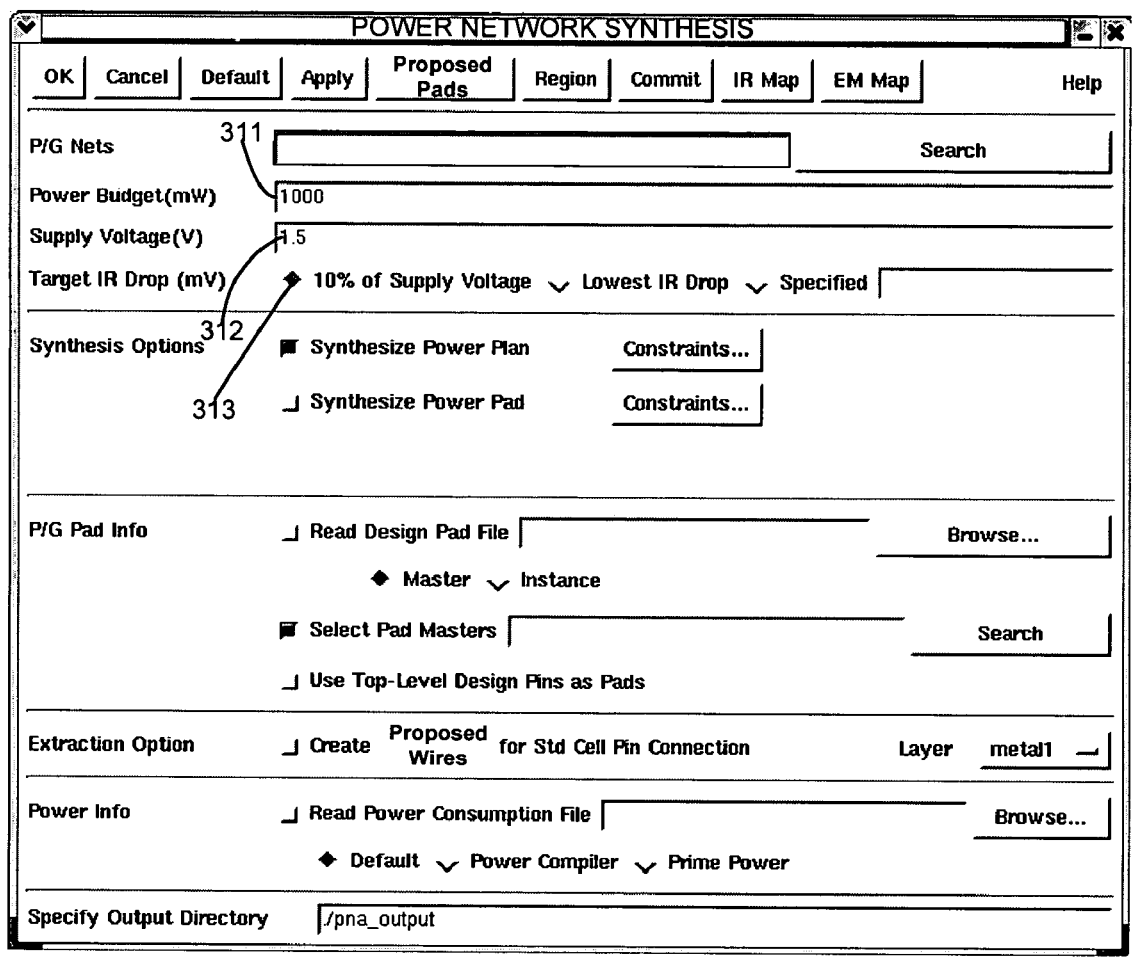
FIGS. 3A and 3B illustrate a graphical user interface (GUI) that is displayed by a computer in one specific exemplary implementation of the invention.
Figure 3B:
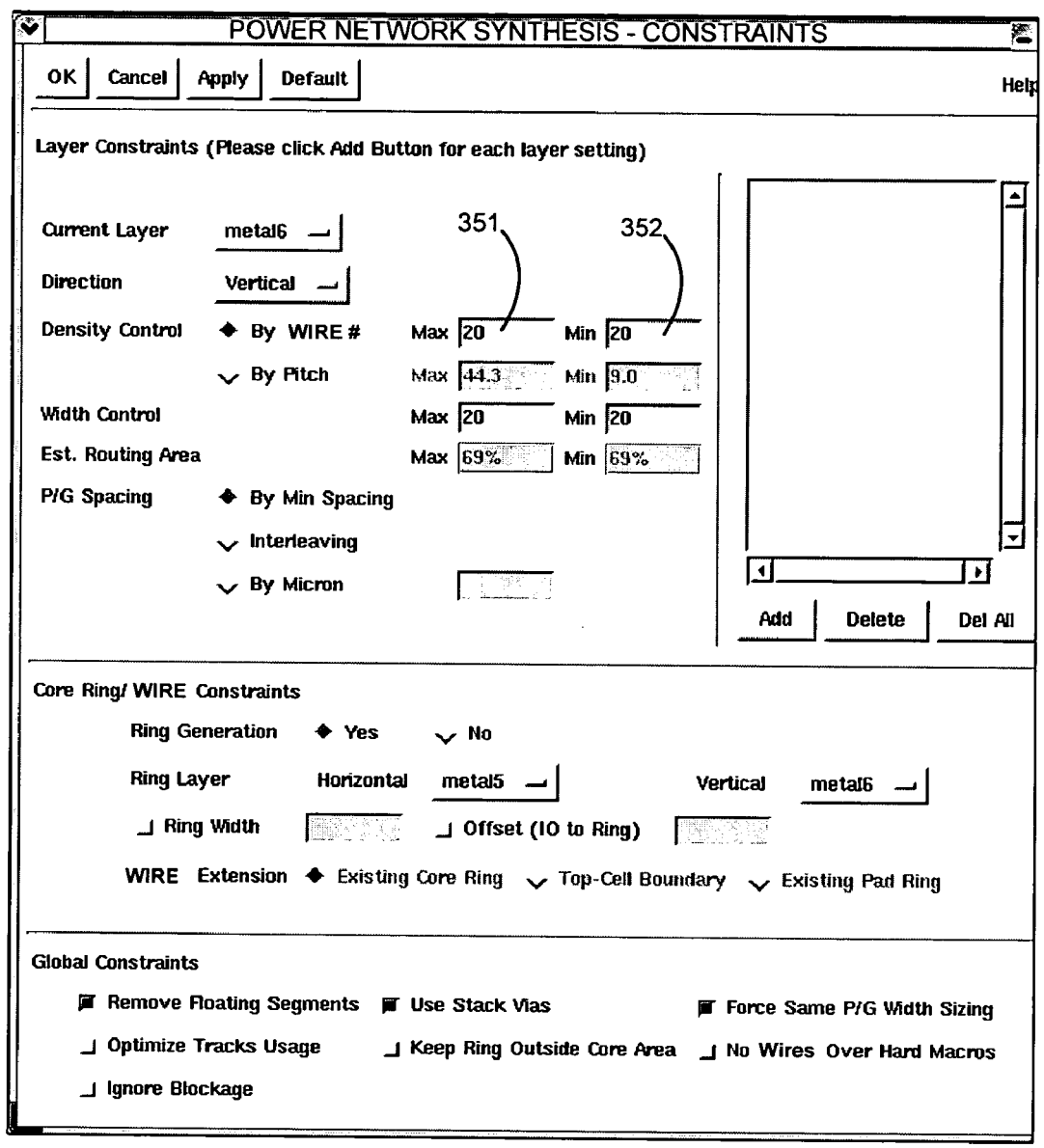

Specifically, during performance of act 112, the analyzer that is invoked by a power network synthesizer of the type described herein obtains improved accuracy by checking whether or not there is any intersection between a power wire and a pin of a hard macro, and if not then making a connection, e.g. by finding in each of four directions (East, West, North, South) the closest wire (regardless of whether pre-existing or proposed) and connecting thereto as described in reference to act 1341 in FIG. 3B of U.S. patent application Ser. No. 10/976,653.

Note that other embodiments may use an analyzer that doesn't make such connections, in which case its accuracy (of the attribute value) is reduced, which in turn may make the resulting power network less than optimal for a given IC design. Note that the just-described connection is created by the power network analyzer as a temporary item, which is used primarily to improve the accuracy of analysis by the power network analyzer. Note that such connections are not part of a power plan being proposed, i.e. they are not proposed as power wires and therefore not added to the IC design when the power plan is committed.

Note further that in some embodiments, act 112 is performed by the same computer that performs acts 111 and 113, and hence the multiple power plans resulting from act 111 are simply kept in the main memory of such a computer.

Next, in stage 110, the programmed computer performs act 113, to select one of the simplified plans that were prepared in act 111. In some embodiments, the computer is programmed to pick a plan that satisfies the user-specified limit on the attribute whose value was computed in act 112. If multiple plans have conforming attribute values, then one of these multiple plans is selected to minimize the routing resources that are used (e.g. by selecting a plan which uses the least number of tracks). At the end of stage 110, the selected simplified plan, identifies a total count of power wires and a width of the power wires, and is provided as input to the second stage 120 which is discussed next.

In stage 120, the programmed computer automatically prepares (as per act 121) a more detailed plan that honors design rule checking constraints and routing blockages. The detailed plan resulting from act 121 is then automatically supplied by the programmed computer to any analyzer of a power network, for calculation of a value of the attribute, e.g. the maximum voltage drop. Next, in act 123, the detailed plan may be changed by the programmed computer, e.g. by increasing the width of proposed wires any number of times, to achieve conformance. Note that act 122 may be performed repeatedly (up to a limit, e.g. 10 times), each time that the detailed plan is changed, to check for conformance to the user-specified limit.

Figure 2A:
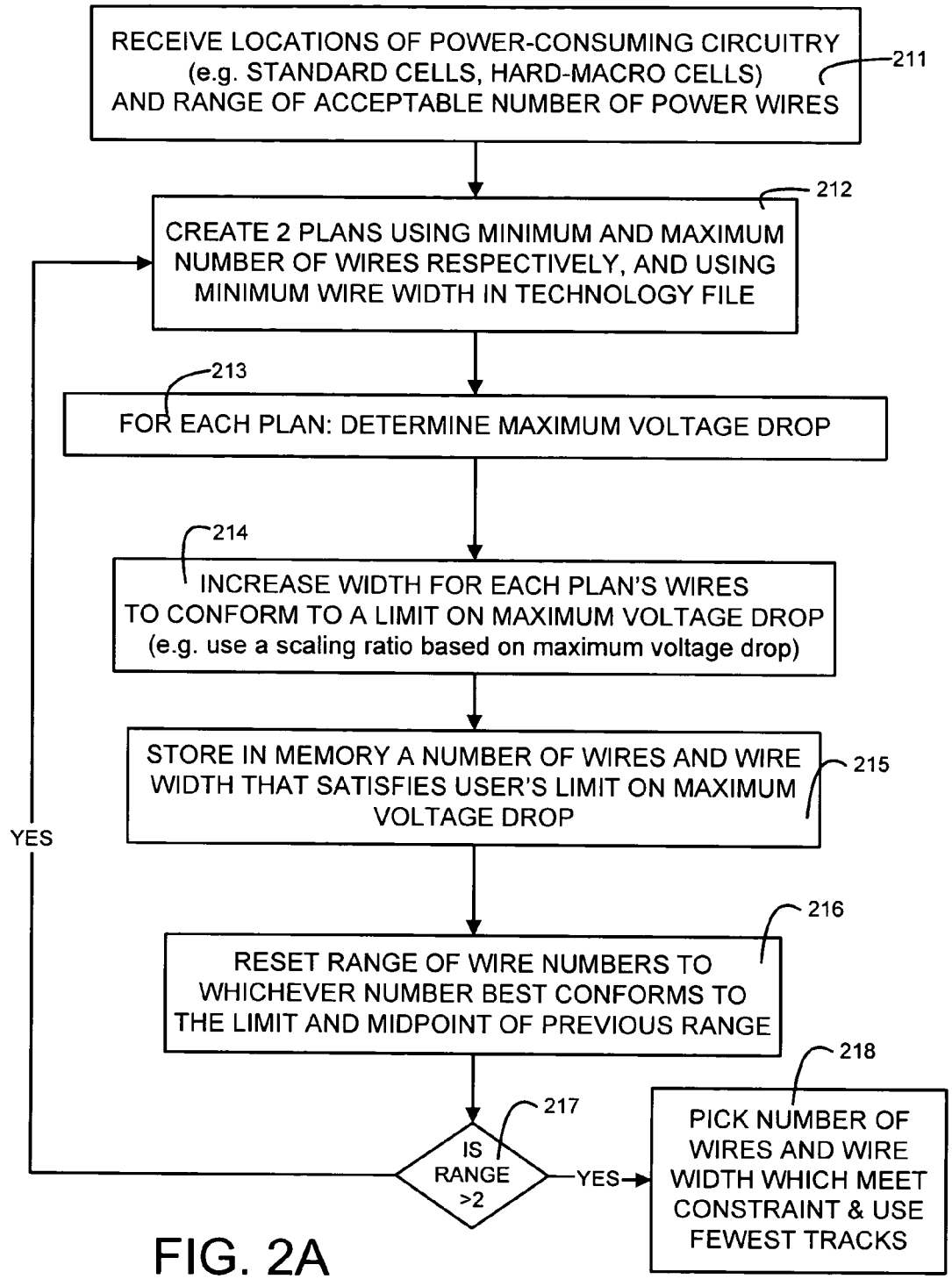
FIG. 2A illustrates, in an intermediate-level flow chart, acts performed in the first stage 110 of FIG. 1B in some embodiments of the invention.

Referring to FIG. 2A, a first stage 110 may be implemented by programming a computer to perform acts 211-218 in some embodiments, as described next. Specifically, in act 211, the programmed computer receives locations of power-consuming circuitry (e.g. standard cells, hard-macro cells which are stored in main memory in data structures illustrated in FIG. 4A) and also receives from a user a range of acceptable number of power wires that can be proposed in the power plan. For example, the cell locations may be received from the MILKYWAY database, and in addition the user may specify a total count for all power wires (regardless of pre-existing or proposed) to be in a range e.g. between max field 351 and min field 352, as shown in the graphical user interface of FIG. 3B. Note that as illustrated in FIG. 3A, the user may also specify a power budget in field 311, a supply voltage in field 312, and that a maximum voltage drop in the IC design when using the proposed power wires is to be no more than 10% of the supply voltage by selecting button 313.

Next, in this particular implementation, the programmed computer prepares two simplified plans, one for the maximum number Nmax of proposed power wires (e.g. 128×128 wire grid) and another for the minimum number Nmin of proposed power wires (e.g. 12×12 wire grid). In doing so, the computer locates the proposed power wires uniformly spaced from one another, across an area of the integrated circuit chip, e.g. by simply dividing a dimension of the IC chip in each direction by the number (e.g. Nmax or Nmin) to be used in the plan. Moreover, the computer uses the minimum wire width as specified in a technology file that is also present in a memory of the computer.

The programmed computer then analyzes (as per act 213) these two simplified plans, which are also referred to as "min" simplified plan and "max" simplified plan, e.g. to find the voltage drop across each proposed power wire, and the maximum voltage drop ΔVmax in the entire design. Note that in doing so, the programmed computer may use existing power pads in the design, and if no power pads exist then a predetermined number (e.g. 4) power pads are automatically proposed on each side of the IC chip. Note that if at least some power wires are pre-existing in the IC design, then at this stage a power pad synthesizer may be invoked to automatically propose power pads which are then used by the programmed computer as discussed below.

Some embodiments invoke a power pad synthesizer of the type described in a concurrently-filed U.S. patent application Ser. No. 10/976,719. Note that in some embodiments, a common graphical user interface (FIG. 3A) is used to invoke each of the two tools, namely a power network synthesizer of the type described herein and the just-described power pad synthesizer. For more information on fields in FIG. 3A see the U.S. patent application Ser. No. 10/976,719. Note that each power wire in a given simplified plan being analyzed is assumed to be connected to power pads (pre-existing or proposed), in order to estimate the voltage drop AV along the power wire.

Next, as per act 214, if the programmed computer finds that maximum voltage drop AVmax in any of "min" simplified plan and "max" simplified plan exceeds a user-specified limit t_ΔV, then it simply increases the wire width in that plan, e.g. scaling up the width by multiplying with the ratio (t_ΔV/ΔVmax). Thereafter, as per act 215, the programmed computer stores in memory whichever (one or both) of the two plans satisfies the user's limit on maximum voltage drop (e.g. stores their number of wires and their wire width as well as their maximum voltage drop).

Next, in act 216, the programmed computer resets the above-described user-provided range of acceptable wire numbers to be (a) midpoint of previous range i.e. (Nmin+Nmax)/2 and (b) whichever number (Nmin or Nmax) best conforms to the limit t_ΔV. If the new range is greater than 2, then as per act 217 the programmed computer returns to act 212 (discussed above). If the new range is less than 2, then one of the plans in memory is selected (as per act 218) based on meeting the user-specified limit t_ΔV, and if several plans are selectable then the plan which uses the fewest tracks is selected.

Figure 2B:
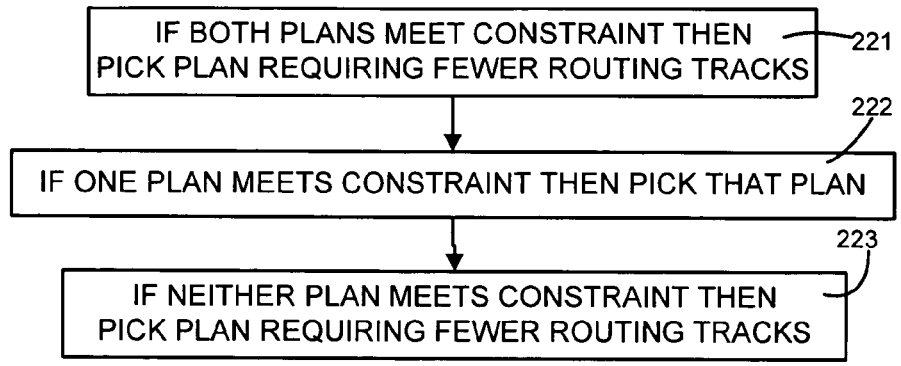
FIG. 2B illustrates, in an low-level flow chart, acts performed in act 215 of FIG. 2A in some embodiments of the invention.

A plan to be used in re-setting the range of search for a next iteration is selected in some embodiments by performing acts 221-223 illustrated in FIG. 2B. Specifically, in act 221, the programmed computer checks if each of the min simplified plan and the max simplified plan meet the user-specified limit t_ΔV, then whichever plan requires the least routing resource is picked as one end of the range on the number of wires to be used in the next iteration. If each of the two plans don't meet the limit, then in act 222, the programmed computer checks if at least one plan meets the user-specified limit t_ΔV, and if so, that plan's number is picked to set one of the boundary points for the range to be used in the next iteration. If neither plan meets the limit, then in act 223, the programmed computer of some embodiments picks whichever plan uses the fewest number of routing tracks, although in other embodiments the programmed computer simply picks a best plan found up to this point (e.g. by going to act 218 in FIG. 2A) and stops the iteration.

Figure 2C:
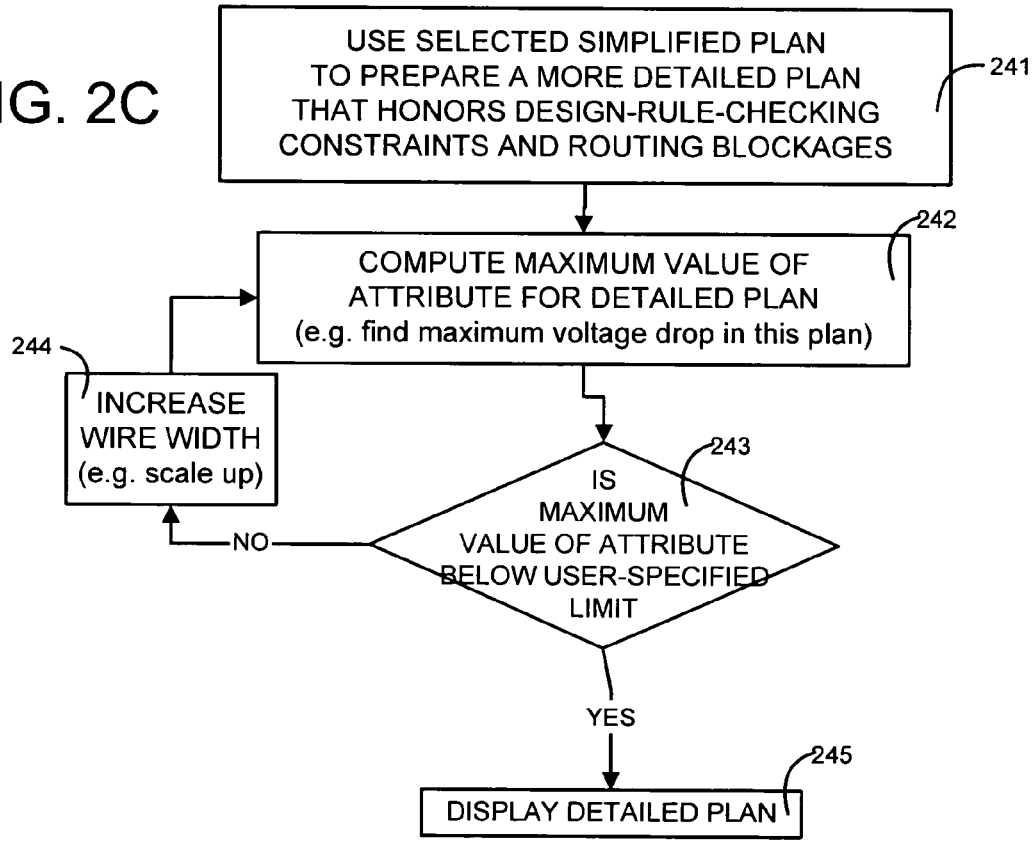
FIG. 2C illustrates, in an intermediate-level flow chart, acts performed in the second stage 120 of FIG. 1B in some embodiments of the invention.

Stage 120 may be implemented in some embodiments by performing acts 241-247 illustrated in FIG. 2C. Specifically, in act 241, the programmed computer uses a selected simplified plan from the previous stage to prepare a more detailed plan that honors design-rule-checking constraints and routing blockages. Note that such a detailed plan can be prepared in any manner well known in the art, although in some embodiments the detailed plan is prepared by pre-forming acts 271-276 as described below in reference to FIG. 2D.

After the detailed plan is prepared, act 242 is implemented in some embodiments by invoking a power network analyzer, to compute the maximum voltage drop in the power plan. Note that the power network analyzer invocation in act 242 takes longer than the invocation in act 112.

Next, as per act 243, the programmed computer checks if the maximum voltage drop is below a user-specified limit and if not the wire width is simply scaled up (or otherwise increased) as per act 244 followed by returning to act 242 (described above). Note that in most embodiments, the iteration resulting from act 244 is performed only a few times (e.g. 2-3 times and in some embodiments only 1 time) because the limit in act 243 is reached relatively quickly.

If in act 243 the answer is yes, then a map of power wires (both proposed and pre-existing) is displayed to the user as per act 245. See FIG. 4B which illustrates the programmed computer providing a display of horizontal and vertical power wires in such a plan, and overlaid with voltage drop resulting from use of these power wires. Next, the user may accept or reject the displayed plan. If the user rejects the displayed plan, then the computer returns to act 211 to display the GUI of FIG. 3A for receipt of another range on which binary search is to be performed. If the user accepts the displayed plan, then the computer goes to act 247 and invokes a power router that adds power wires (based on the displayed plan) to a database which contains the IC design, as described above in reference to act 109 (FIG. 1A).

Figure 2D:
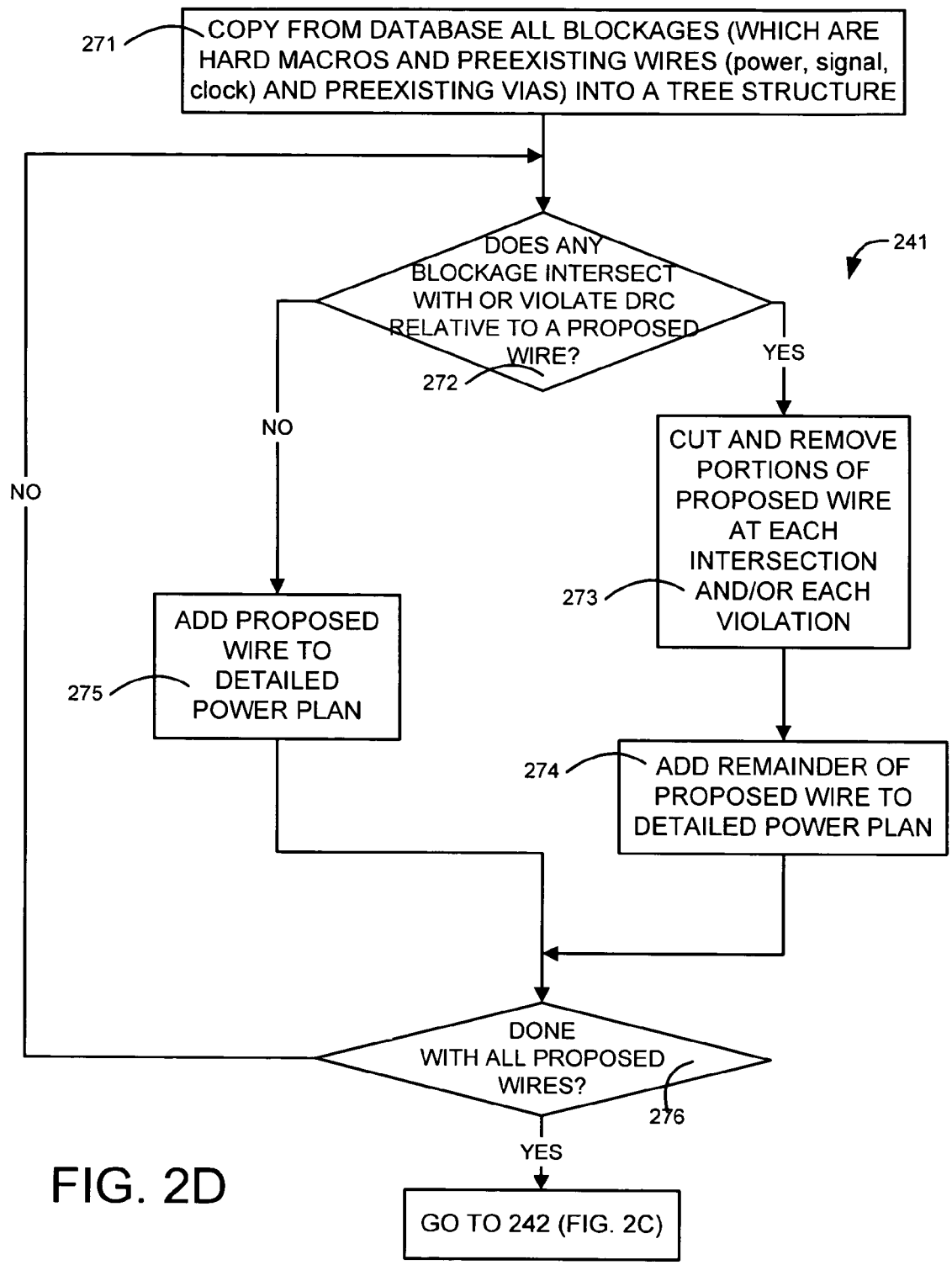
FIG. 2D illustrates, in a low-level flow chart, acts performed in operation 241 of FIG. 2C in some embodiments of the invention.

Note that in some embodiments, act 241 of FIG. 2C is performed as illustrated in FIG. 2D. Specifically, in act 271, the programmed computer simply copies, from the IC design database, all blockages (such as, for example, hard macros and preexisting wires (power, signal, clock) and preexisting vias. The blockages are copied into a tree structure, such as a four dimensional KD tree for use in finding intersections with the proposed power wires in the simplified power plan, as discussed next.

Next, in act 272, the programmed computer checks, if any blockage intersects with or violates a DRC rule relative to a proposed power wire. Note that each proposed power wire in the simplified plan is checked individually, one at a time. If the answer is yes in act 272, then the programmed computer goes to act 273 and cuts and removes any portions of the proposed power wire that intersect with or cause DRC violation of a blockage. Next, in act 274, the programmed computer adds any wire segments that remain (of the proposed wire) to the detailed plan that is under preparation. In act 272 if the answer is no, then the entire proposed power wire is added to the detailed plan (as per act 275). Next, the programmed computer checks, as per act 276 if all proposed power wires have been processed and if so goes to act 242 (discussed above in reference to FIG. 2C). If not all proposed power wires have been processed, then the programmed computer returns to act 272 to process another proposed power wire.

Note that the user may request proposal of power wires for just one network at a given voltage (e.g. at voltage Vdd or Vss), depending on their need. If the user selects synthesis of two or more networks (e.g. power and ground both), then in certain embodiments, first stage 110 is performed only for the power network and not performed for the ground network. The second stage 120 for the ground network uses a result from the first stage 110 for the power network, because the same number of wires are used in both the power network and the ground network. In these embodiments, second stage 120 is performed for both networks (power and ground). Note that the second stage is performed for each of two networks, and the two directions (horizontal and vertical) for each network are handled together. Therefore, in a typical situation when the user requests a power network plan for the entire IC design, first stage 110 is performed once, and second stage 120 is performed two times.

Figure 5:
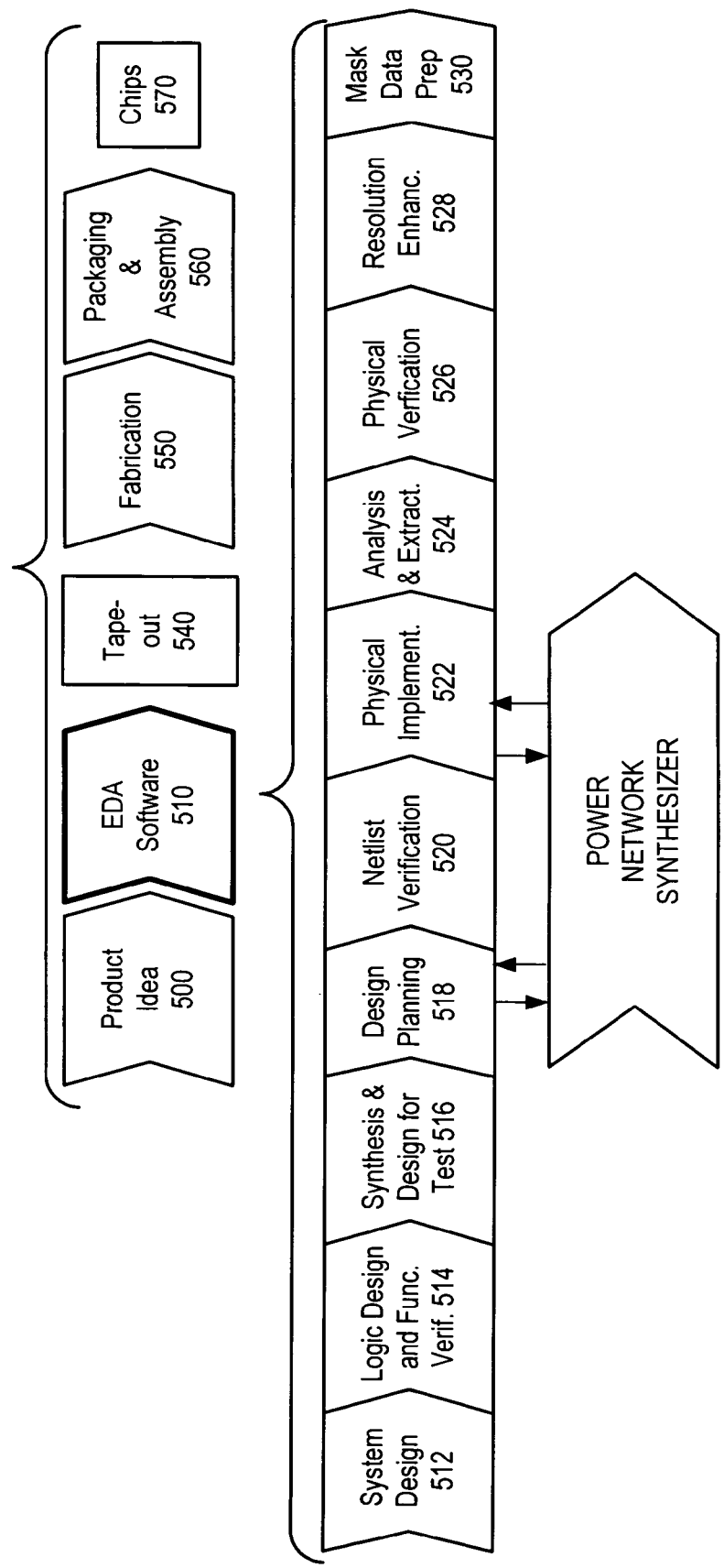
FIG. 5 illustrates, a simplified representation of an exemplary digital ASIC design flow in accordance with the invention.

It may be helpful to place this process in context. FIG. 5 shows a simplified representation of an exemplary digital ASIC design flow. At a high level, the process starts with the product idea (500) and is realized in a EDA software design process (510). When the design is finalized, it can be taped-out (event 540). After tape out, the fabrication process (550) and packaging and assembly processes (560) occur resulting, ultimately, in finished chips (result 570).

The EDA software design process (510) is actually composed of a number of stages 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 510) will now be provided.

System design (stage 512): The circuit designers (FIG. 4B) describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 514): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products.

Synthesis and design for test (stage 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Figure 4B:
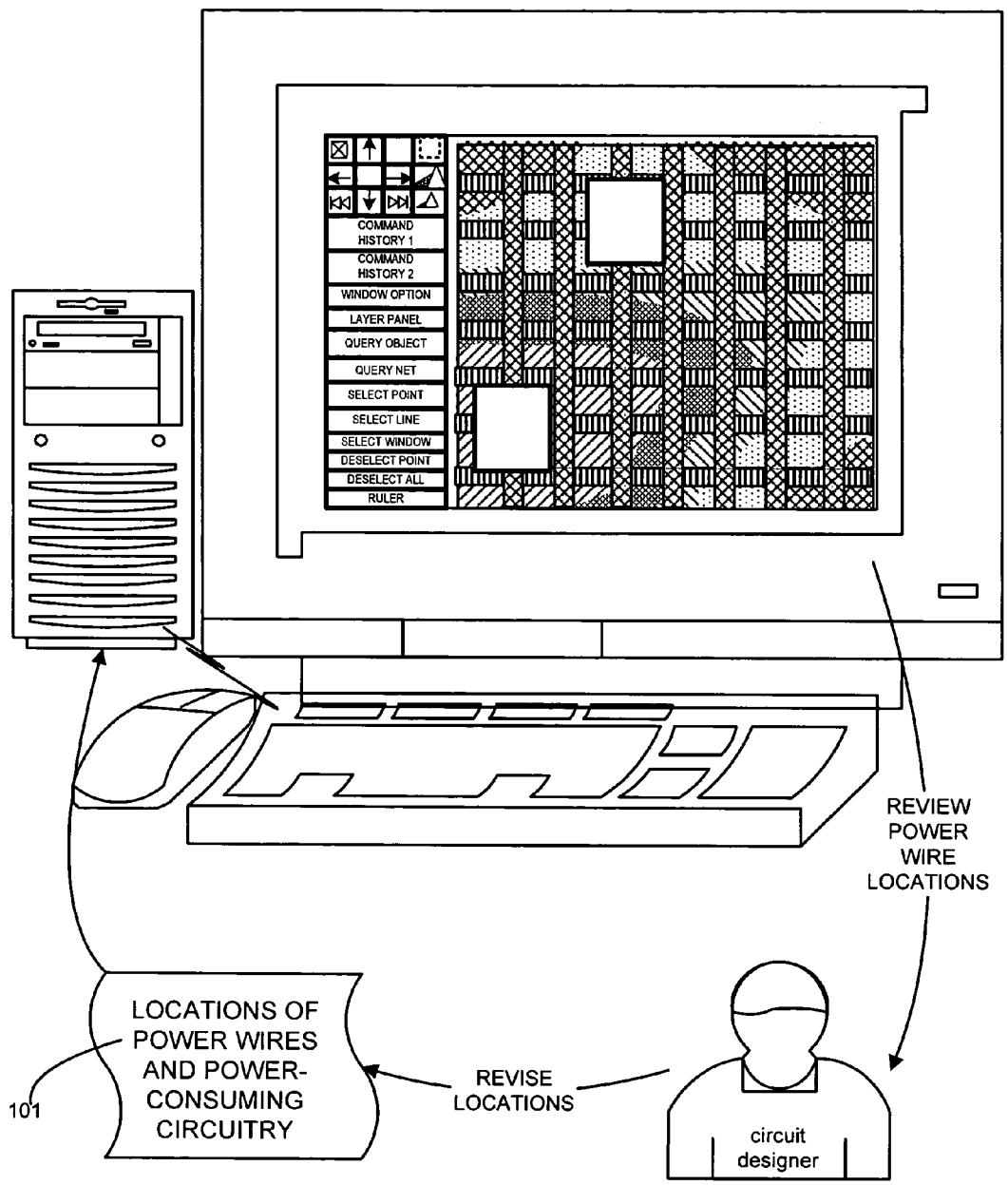
FIG. 4B illustrates, in a block diagram, the computer of FIG. 4A displaying results in the exemplary implementation to a human, including a display of locations of two hard macro cells at the top center and bottom left corner of the display.

Design planning (stage 518): Here, an overall floorplan for the chip is constructed and analyzed for timing and top-level routing. Exemplary EDA software products from Synopsys, Inc. that can be used at this stage include Jupiter and Floorplan Compiler products. Note that various acts of the type described above in reference to FIG. 1B are performed in stage 518 of some embodiments. Hence, although circuitry and portions thereof (such as standard cells) are described herein as if they exist in the real world, it is to be understood that at this stage only a computer model exists in a programmed computer (FIG. 4B). The actual circuitry in the real world is created after this stage as discussed next.

Note that a power network synthesizer of the type described herein may receive an IC design of the type prepared by design planning stage 518, and store the wires being synthesized into the IC design if approved by the circuit designer. Then the modified IC design including the power wires (that were previously proposed but are now present therein) is loaded back into a tool in the design planning stage 518 for design changes. Examples of design changes that can be done are changing locations of blockages (pads, hard macros, and wires). After such design changes, the circuit designer can again invoke the power network synthesizer, thereby forming an iterative loop.

Netlist verification (stage 520): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 522): The placement (positioning of circuit elements) and routing (connection of the same) occurs at this step. Exemplary EDA software products from Synopsys, Inc. that can be used at this stage include the Astro product.

Note that a power network synthesizer of the type described herein may also receive an IC design of the type prepared by physical implementation stage 522. Note that a new plan for the power network may be synthesized, e.g. if the pre-existing power wires cause congestion in routing of signal wires or clock wires. Moreover, a power budget can be changed by the circuit designer in view of a final netlist that is now available (which was not available at the design planning stage). Once the new plan is prepared by the power network synthesizer, the wires being synthesized are stored into the IC design if approved by the circuit designer. Then the modified IC design including the power wires being proposed is loaded back into a tool in the physical implementation stage 522 for use of the plan in fabrication of the IC design.

Analysis and extraction (stage 524): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 526): At this various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 528): This involves geometric manipulations of the layout to improve manufacturability of the design. Exemplary EDA software products from Synopsys, Inc. that can be used at this include iN-Phase, Proteus, and AFGen products.

Mask data preparation (stage 530): This provides the "tape-out" data for production of masks for lithographic use to produce finished chips. Exemplary EDA software products from Synopsys, Inc. that can be used at this include the CATS(R) family of products.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 1A.

Note that a KD tree of four dimensions may be used in some embodiment as discussed in the pseudo-code listed in the attached appendix, to store power wires as rectangles, wherein each node stores two diagonally opposite corners of a bounding box (e.g. upper left and lower right corners). For each corner, two coordinates, x and y coordinates are stored, so that a total of four dimensions are stored. Note that the following functions are used in this embodiment: (a) insertion (to insert rectangles into the KD tree), (b) range query (to check if any rectangle in the KD tree overlaps in any manner (i.e. intersects) with a given rectangle identified in the query), (c) neighbor search (to identify a closest neighbor to a given rectangle in each of four directions).

Numerous modifications and adaptations of the embodiments described herein will become apparent to the skilled artisan in view of this disclosure.

Although two stages are used in some embodiments, other embodiments may use a single stage. In such an alternative embodiment, in act 111, all plans that are prepared take into account DRC constraints and routing blockages, although the alternative embodiment is slower because the number of wires in each of the iterations is increased.

Note that rectangles for power wires in simplified power plans as well as detailed power plans of some embodiments are not related in any manner to instances in the IC design (such as standard cells or macro cells) until after commitment, although in other embodiments one or more such rectangles (in detailed power plans and optionally even in simplified power plans) are connected to instances (e.g. to a power cell or a pad cell).

Numerous modifications and adaptations of the embodiments described herein are encompassed by the scope of the invention.

What is claimed is:

1. A method of synthesizing a power plan for an integrated circuit device, the method being performed in a computer, the method comprising:
a first stage comprising:
preparing, for an area of the integrated circuit device, a plurality of first plans;
wherein the first plans are alternatives to one another and identify locations, in said area, of power wires to be included in a design of said integrated circuit device;
computing a value of an attribute for each first plan in the plurality of first plans;
selecting, from among the plurality of first plans, a first plan whose value for the attribute conforms to a user-specified limit; and
a second stage comprising:
preparing a second plan honoring a design rule checking (DRC) rule and based on the first plan selected by said selecting;
wherein the second plan identifies locations, in said area, of power wires to include in said design of said integrated circuit device.

2. The method of claim 1 wherein:
the attribute is maximum voltage drop; and
the first plan which is selected by said selecting has its value for the maximum voltage drop less than the user-specified limit.

3. The method of claim 1 further comprising:
automatically displaying the second plan if the additional value of the attribute conforms to the user-specified limit.

4. The method claim 1 wherein:
the first plan, which is selected by said selecting is selected for using least routing resource.

5. The method of claim 1 further comprising:
increasing width of at least one wire in the second plan if an additional value of the attribute for the second plan does not conform to said user-specified limit.

6. A carrier wave encoded with instructions to perform the method of claim 1.

7. A computer-readable storage medium encoded with instructions to perform the method of claim 1.

8. The method of claim 1 further comprising:
adding power wires based on the second plan to a database containing the design of said integrated circuit device.

9. The method of claim 1 wherein:
said plurality of first plans comprises a max first plan, a min first plan and a plurality of additional plans; and
said preparing creates said max first plan using a maximum value of a design parameter and creates said min first plan using a minimum value of the design perarmeter.

10. The method of claim 9 wherein:
the design parameter is number of power wires.

11. The method of claim 9 further comprising:
automatically increasing width of at least one wire in one of the (max first plan and min first plan) second plan if a maximum voltage drop therein exceeds a user-specified limit.

12. The method of claim 9 further comprising:
adding power wires based on the second plan to a database containing the design of said integrated circuit device.

13. The method of claim 9 further comprising:
performing a binary search within a range between the minimum value and the maximum value.

14. The method of claim 1 wherein:
the design of said integrated circuit device comprises at least one blockage; and
each first plan in said plurality of first plans is prepared without checking if any power wire therein violates said design rule checking (DRC) rule relative to said blockage.

15. The method of claim 14 further comprising:
automatically computing for each first plan, a maximum voltage drop therein;
wherein said selecting selects the first plan based at least on (a) conformance of said maximum voltage drop to a user-specified limit and (b) use of routing resource;
automatically computing the maximum voltage drop in said second plan; and
automatically changing the second plan if a value for said maximum voltage drop therein does not conform to the user-specified limit.

16. The method of claim 14 further comprising:
cutting and removing a portion of the power wire in the second plan on finding a violation of said DRC rule.

17. The method of claim 1 further comprising:
automatically computing an additional value of the attribute, for the second plan; and
automatically changing the second plan if the additional value of the attribute does not conform to the user-specified limit.

18. An apparatus for synthesizing a power plan for an integrated circuit device, the apparatus comprising:
a memory;
means for preparing, for an area of the integrated circuit device, a plurality of first plans;
wherein the first plans are alternatives to one another and identify locations, in said area, of power wires to be included in a design of said integrated circuit device;
wherein the first plans and the design are stored in the memory;
means for selecting, from among the plurality of first plans, a first plan; and
means for preparing a second plan honoring a plurality of design rule checking constraints, based on the first plan selected by said means for selecting.

* * * * *